(12) United States Patent
Park et al.

(10) Patent No.: US 10,933,401 B2
(45) Date of Patent: Mar. 2, 2021

(54) MAGNETIC CESIUM ADSORBENT, PREPARATION METHOD THEREFOR, AND CESIUM REMOVAL METHOD USING SAME

(71) Applicant: KOREA ATOMIC ENERGY RESEARCH INSTITUTE, Daejeon (KR)

(72) Inventors: Tae Hong Park, Sejong (KR); Young Jin Cho, Seoul (KR); Sang Eun Bae, Sejong (KR); Sang Ho Lim, Sejong (KR); Jai Il Park, Daejeon (KR); Young Sang Youn, Sejong (KR); Jei Won Yeon, Daejeon (KR)

(73) Assignee: KOREA ATOMIC ENERGY RESEARCH INSTITUTE, Daejeon (KR)

(*) Notice: Subject to any disclaimer, the term of this patent is extended or adjusted under 35 U.S.C. 154(b) by 0 days.

(21) Appl. No.: 16/315,075

(22) PCT Filed: Jul. 4, 2017

(86) PCT No.: PCT/KR2017/007057
§ 371 (c)(1),
(2) Date: Jan. 3, 2019

(87) PCT Pub. No.: WO2018/008930
PCT Pub. Date: Jan. 11, 2018

(65) Prior Publication Data
US 2019/0210004 A1 Jul. 11, 2019

(30) Foreign Application Priority Data
Jul. 4, 2016 (KR) .................. 10-2016-0084287

(51) Int. Cl.
*B01J 20/28* (2006.01)
*B01J 20/22* (2006.01)
(Continued)

(52) U.S. Cl.
CPC ........ *B01J 20/28009* (2013.01); *B01D 35/06* (2013.01); *B01J 20/22* (2013.01);
(Continued)

(58) Field of Classification Search
None
See application file for complete search history.

(56) References Cited

U.S. PATENT DOCUMENTS

2014/0050982 A1* 2/2014 Lu ..................... H01M 4/58
429/211
2015/0287991 A1* 10/2015 Lu ..................... H01M 10/054
252/182.1

FOREIGN PATENT DOCUMENTS

JP 2006-256954 A 9/2006
JP 2012-527344 A 11/2012
(Continued)

OTHER PUBLICATIONS

Wang et al. (Agewandte Communications, 2013, 52, 1964-1967). (Year: 2013).*
(Continued)

*Primary Examiner* — Clare M Perrin
(74) *Attorney, Agent, or Firm* — Don D Cha; HDC IP Law, LLP

(57) ABSTRACT

The present invention relates to a magnetic cesium adsorbent, a preparation method therefor, and a cesium removal method using the same, the preparation method comprising the steps of: (a) preparing a metal hexacyanoferrate; and (b) hydrothermally reacting the metal hexacyanoferrate so as to prepare a metal hexacyanoferrate having a rhombohedral crystal structure.

17 Claims, 4 Drawing Sheets

(51) Int. Cl.

| | |
|---|---|
| C02F 1/58 | (2006.01) |
| C02F 1/28 | (2006.01) |
| B01J 20/30 | (2006.01) |
| B03C 1/28 | (2006.01) |
| C30B 7/10 | (2006.01) |
| C30B 29/10 | (2006.01) |
| B01D 35/06 | (2006.01) |
| G21F 9/12 | (2006.01) |
| B01J 20/02 | (2006.01) |
| C02F 101/00 | (2006.01) |

(52) U.S. Cl.
CPC ............ *B01J 20/223* (2013.01); *B01J 20/28* (2013.01); *B01J 20/28004* (2013.01); *B01J 20/28016* (2013.01); *B01J 20/30* (2013.01); *B01J 20/3085* (2013.01); *B03C 1/288* (2013.01); *C02F 1/28* (2013.01); *C02F 1/58* (2013.01); *C30B 7/10* (2013.01); *C30B 29/10* (2013.01); *G21F 9/12* (2013.01); *B03C 2201/18* (2013.01)

(56) References Cited

FOREIGN PATENT DOCUMENTS

| | | |
|---|---|---|
| JP | 2013-101097 A | 5/2013 |
| JP | 2013127372 A | 6/2013 |
| JP | 2014102085 A | 6/2014 |
| JP | 2015-515081 A | 5/2015 |
| WO | WO2015/186819 A1 | 12/2015 |

OTHER PUBLICATIONS

Zhang et al. (Scientific Reports, 2015, pp. 1-11). (Year: 2015).*
Ji et al. (Applied Materials and Interfaces, 2016, 8, 33619-33625). (Year: 2016).*
Zhang et al. (Journal of Hazardous Materials, 2009, 167, 1057-1062). (Year: 2009).*
Brinzei et al. (Inorganica Chimica Acta, 2008, 361, 3931-3936). (Year: 2008).*
Puzyrnaya et al. (Journal of Water Chemistry and Technology, 2017, 39, 73-79). (Year: 2017).*
Loos-Neskovic, C. et al., "Structure of copper-potassium hexacyanoferrate (II) and sorption mechanisms of cesium," J. Solid St. Chem., 2004, v. 177, pp. 1817-1828.
Ding, D. et al., "Selective removal of cesium from aqueous solutions with nickel (II) hexacyanoferrate (III) functionalized agricultural residue—walnut shell," J. Haz. Mater., 2014, v. 270, pp. 187-195.
Jang, J. et al., "Magnetic Prussian Blue Nanocomposites for Effective Cesium Removal from Aqueous Solution," Ind. & Eng. Chem. Res., 2016, v. 55, pp. 3852-3860.
Jang, S.-C., et al., "Removal of Radioactive Cesium Using Prussian Blue Magnetic Nanoparticles," Nanomaterials, 2014, v. 4, pp. 894-901.
Martinez-Garcia, R. et al., "Modification of the magnetic properties in molecular magnets based on Prussian blue analogues through adsorbed species," 2006, v. 18, pp. 11243-11254.

* cited by examiner

MAGNETIC CESIUM ADSORBENT, PREPARATION METHOD THEREFOR, AND CESIUM REMOVAL METHOD USING SAME

CROSS-REFERENCE TO RELATED APPLICATIONS

This is a U.S. National Stage Application under 35 U.S.C. § 371 of PCT Patent Application No. PCT/KR2017/007057, filed Jul. 4, 2017, which claims priority of Korean Patent Application No. 10-2016-0084287, filed Jul. 4, 2016, all of which are incorporated herein by reference in their entirety

FIELD OF THE INVENTION

The present invention relates to a magnetic cesium adsorbent including a metal hexacyanoferrate having a rhombohedral crystal structure, a method of preparing the same and a method of removing cesium using the same.

BACKGROUND OF THE INVENTION

Cs-137 is one of the major radioactive isotopes generated during nuclear fission, and its half-life is approximately 30 years. Particularly, when a serious accident occurs in a nuclear power facility such as a nuclear power plant, a large amount of Cs-137 may be released, which can seriously pollute soil, a river, or a sea.

A metal hexacyanoferrate such as Prussian blue is known as a very effective adsorbent in removal of Cs-137 in water and soil polluted by radioactive elements due to an excellent selective Cs-adsorbing ability. However, since a size of the metal hexacyanoferrate particle is very small, it is very difficult to remove the Cs-137-adsorbed metal hexacyanoferrate by filtration through a filter in the field. As a method of overcoming the above-mentioned problems, methods of preparing a composite in which magnetic nanoparticles are conjugated with a metal hexacyanoferrate and isolating the composite from a solution using a magnetic field are being studied.

SUMMARY OF THE INVENTION

The present invention is directed to providing a method of preparing a magnetic cesium adsorbent, which includes: (a) preparing a metal hexacyanoferrate; and (b) preparing a metal hexacyanoferrate having a rhombohedral crystal structure through a hydrothermal reaction of the metal hexacyanoferrate.

However, technical problems to be solved in the present invention are not limited to the above-described problems, and other problems which are not described herein will be fully understood by those of ordinary skill in the art from the following descriptions.

The present invention provides a method of preparing a magnetic cesium adsorbent: (a) preparing a metal hexacyanoferrate; and (b) preparing a metal hexacyanoferrate having a rhombohedral crystal structure through a hydrothermal reaction of the metal hexacyanoferrate.

In one exemplary embodiment of the present invention, a magnetic cesium adsorbent including a metal hexacyanoferrate having a rhombohedral crystal structure is provided.

In another exemplary embodiment of the present invention, a method of removing cesium, which includes: adsorbing cesium by dispersing the magnetic cesium adsorbent in a solution containing a cesium ion; and separating a cesium-adsorbed magnetic cesium adsorbent using a magnet or filter.

A magnetic cesium adsorbent including a metal hexacyanoferrate having rhombohedral crystal structure according to the present invention is prepared through a simple hydrothermal reaction of a metal hexacyanoferrate, and preferably, a metal (particularly, nickel or manganese) hexacyanoferrate having a cubic crystal structure, which has a high cesium adsorption rate, and therefore, due to its magnetic property without separately introducing magnetic nanoparticles, the magnetic cesium adsorbent can be separated using a magnet, and since a particle size is increased by the hydrothermal reaction, separation using a filter can also be facilitated.

Accordingly, in the event of a major accident at a nuclear facility such as a nuclear power plant, there is an advantage in which Cs-137, which is one of the major radioactive isotopes occurring in nuclear fission, can be effectively removed.

DETAILED DESCRIPTION OF THE INVENTION

Figure 1:
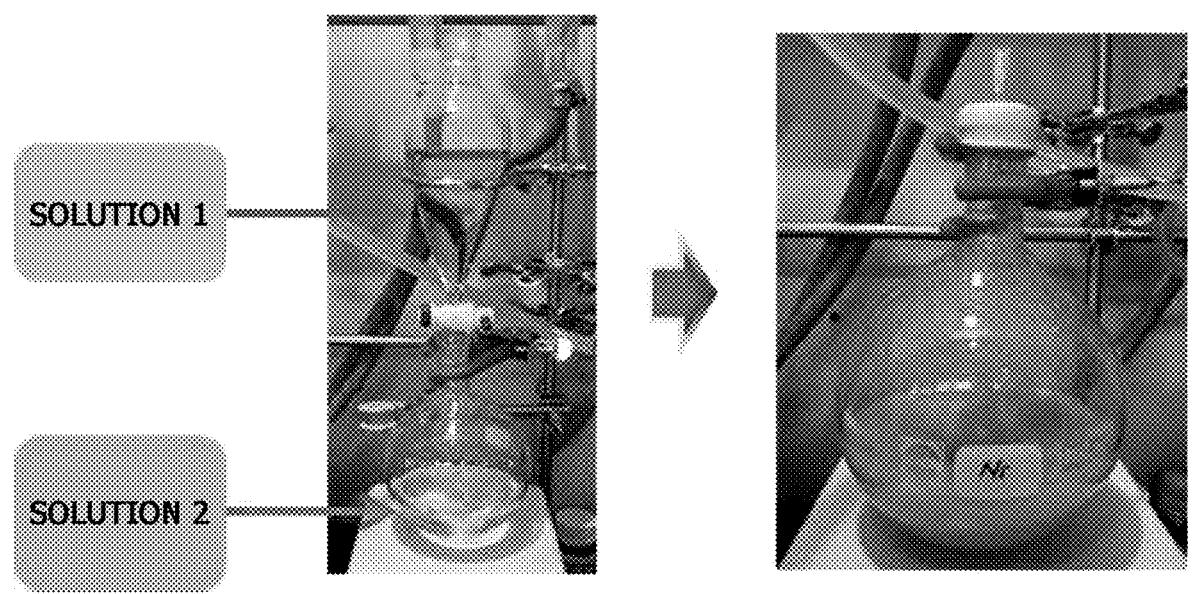
FIG. 1 is an image illustrating a method of preparing nickel hexacyanoferrate having a cubic crystal structure.

During research on a cesium adsorbent, the inventors had prepared a cesium adsorbent including a metal hexacyanoferrate having a rhombohedral crystal structure through a hydrothermal reaction and confirmed an average particle size, a magnetic property and a cesium adsorption rate, and therefore the present invention was completed.

Conventionally, a composite in which magnetic nanoparticles and a metal hexacyanoferrate are conjugated is prepared, and then separation methods for a solution using a magnetic field have been researched. However, to prepare such a composite, a synthesis process for conjugating magnetic nanoparticles and a metal hexacyanoferrate is required, and for the composite to exhibit sufficient magneticity to be separated with a magnetic field, a proportion of the magnetic nanoparticles in the composite is relatively high, compared to the metal hexacyanoferrate, and thus Cs-137 adsorption performance was degraded. In the present invention, a metal hexacyanoferrate having a magnetic property without separately introducing magnetic nanoparticles is prepared.

Hereinafter, the present invention will be described in detail.

Magnetic Cesium Adsorbent

The present invention provides a method of preparing a magnetic cesium adsorbent, which includes: (a) preparing a metal hexacyanoferrate; and (b) preparing a metal hexacyanoferrate having a rhombohedral crystal structure through a hydrothermal reaction of the metal hexacyanoferrate.

The "magnetic cesium adsorbent" used herein is a cesium adsorbent with a paramagnetic property at room temperature without separately introducing magnetic nanoparticles, and which has a rhombohedral crystal structure in which there is a change in electronic structure of a metal ion through a hydrothermal reaction.

In addition, the term "cubic crystal structure" used herein refers to a polyhedron consisting of 6 squares, which has an equiaxed crystalline structure. The rhombohedral crystal structure in the specification is a polyhedron consisting of 6 rhombi, which has three axes with the same lengths and an axial angle is not 900.

First, the preset invention includes the step of (a) preparing a metal hexacyanoferrate, wherein the metal hexacyanoferrate may be prepared by reacting a metal compound and a hexacyanoferrate precursor.

Specifically, the metal compound may be a transition metal-containing compound, in which the transition metal may be at least one selected from the group consisting of nickel, manganese, iron, cobalt and copper. In one example, the compound may be $Ni(OCOCH_3)_2.4H_2O$ or $Mn(OCOCH_3)_2.4H_2O$, and may be provided as a solution by being dissolved in water and a DMF solvent.

In addition, a hexacyanoferrate precursor may be one or more selected from the group consisting of sodium hexacyanoferrate ($Na_4Fe(CN)_6$), potassium hexacyanoferrate ($K_4Fe(CN)_6$) and ammonium hexacyanoferrate (($NH_4)_4Fe(CN)_6$), and provided as a solution by being dissolved in water.

The metal hexacyanoferrate prepared by reacting the metal compound with the hexacyanoferrate precursor may have a cubic crystal structure. That is, the metal hexacyanoferrate before a hydrothermal reaction has a cubic crystal structure, which does not have a sufficient magnetic property to typically respond to a magnet at room temperature. Therefore, since the metal hexacyanoferrate before a hydrothermal reaction does not have a sufficient magnetic property at room temperature, to separate the metal hexacyanoferrate using a magnet, it is necessary to separately introduce magnetic nanoparticles.

Meanwhile, exceptionally, manganese hexacyanoferrate before a hydrothermal reaction may have a slight magnetic property. However, manganese hexacyanoferrate before a hydrothermal reaction is in a state before there is a change in the electronic structure of a metal ion, and therefore, the manganese hexacyanoferrate itself may not have a sufficient magnetic property.

In the metal hexacyanoferrate, the carbon atoms of the cyano ligands form six coordinate bonds with the ferric ion, and the nitrogen atoms of the cyano ligands form six coordinate bonds with a metal ion, thereby having an open framework structure of the cubic crystal structure, and through the open framework structure, cations such as $Na^+$ may enter. At this time, the cations such as $Na^+$ migrate to a transition metal substituted with iron having a cubic crystal backbone structure and are interacted with the transition metal, resulting in a rhombohedral crystal structure.

At this time, the metal ion may be a nickel or manganese ion among at least one of various transition metal ions selected from the group consisting of nickel, manganese, iron, cobalt and copper. Since nickel or manganese is an element that is abundant in the earth's crust, a cost of synthesizing a metal hexacyanoferrate is low, and since nickel or manganese hexacyanoferrate having a cubic structure has been known to selectively and easily adsorb cesium, it can be preferably applied to the present invention among the variety of transition metal ions. Particularly, when a nickel ion is applied, compared with when a different transition metal is applied, nickel hexacyanoferrate is superior in terms of stability.

Subsequently, the present invention includes the step of (b) preparing a metal hexacyanoferrate having a rhombohedral crystal structure through a hydrothermal reaction of the metal hexacyanoferrate.

The term "hydrothermal reaction" used herein refers to a liquid-phase reaction of synthesizing or growing a crystal in a water or an aqueous solution at a high temperature under a high pressure, which is a method generally used when it is difficult to perform direct melting of a compound under general conditions (<100° C., <1 atm). Specifically, a reactant is put into a pressure vessel (sealed pressure vessel), the vessel is filled with water or an aqueous solution in a considerable quantity and then sealed, followed by heating to a high temperature. The pressure vessel may be an autoclave. At this time, a reaction occurs in the pressure vessel at a high temperature under a high pressure while a water or aqueous solution requirement is maintained. When the temperature is reduced after the end of the reaction, a product is extracted by oversaturated amount. When the temperature in the pressure vessel is increased to more than a boiling point of water or an aqueous solution, a very high pressure is created in the pressure vessel, and therefore it is preferable to use a pressure vessel made of special steel which can withstand a high pressure.

Through the hydrothermal reaction, the crystal structure of a reactant may be changed, and an average particle size may be increased.

Specifically, the hydrothermal reaction is preferably performed at 120 to 200° C. under 2 to 15 bar for 20 minutes to 20 hours, but the present invention is not limited thereto.

In addition, a temperature condition of the hydrothermal reaction is preferably maintained to 120 to 200° C., but the present invention is not limited thereto. At this time, when the temperature condition is less than 120° C., due to an insufficient change in the electronic structure of a metal ion, the magnetic property may not be achieved, and when the temperature condition is more than 200° C., the metal hexacyanoferrate is decomposed.

In addition, the pressure condition of the hydrothermal reaction is regulated by a pressure in the pressure vessel, it is preferable to maintain 2 to 15 bar, but the present invention is not limited thereto.

In addition, the hydrothermal reaction may be performed for 20 minutes to 20 hours, preferably 3 to 10 hours, and more preferably, 3 to 5 hours, but the present invention is not limited thereto. At this time, when the hydrothermal reaction is performed for less than 20 minutes, there is a problem in that the electronic structure of the metal ion is not sufficiently changed so that the magnetic property cannot be achieved, and when the hydrothermal reaction is performed for more than 20 hours, due to excessive deformation of the metal hexacyanoferrate, a cesium adsorption rate is reduced.

The present invention may further include a step of removing and drying water or an aqueous solution used in the hydrothermal reaction after the hydrothermal reaction.

The metal hexacyanoferrate prepared through the hydrothermal reaction of the metal hexacyanoferrate has a rhombohedral crystal structure. Such a rhombohedral crystal structure is identified by an XRD pattern, and specifically, nickel hexacyanoferrate having a rhombohedral crystal structure may show characteristic XRD peaks at 17, 24, 25, 35, 38.5, 39.8, 49.5, 51, 53.5, 56.2 and 57.4 2θ (±0.2°).

Manganese hexacyanoferrate having a rhombohedral crystal structure may show characteristic XRD peaks at 17, 23.5, 24.2, 34.2, 37.8, 38.5, 48.2, 49.5, 52.2, 54.8 and 55.6 2θ (±0.2°).

That is, the metal hexacyanoferrate after the hydrothermal reaction has a rhombohedral crystal structure and a magnetic property.

In addition, since an average particle size of the metal hexacyanoferrate prepared through the hydrothermal reaction of the metal hexacyanoferrate may be 0.1 µm to 1 mm and larger than that of Prussian blue, it is easily separated through a filter after cesium adsorption.

Magnetic Cesium Adsorbent

The present invention provides a magnetic cesium adsorbent containing a metal hexacyanoferrate having a rhombohedral crystal structure.

The magnetic cesium adsorbent is prepared through the above-described hydrothermal reaction, and when the metal ion of the metal hexacyanoferrate having a rhombohedral crystal structure is a nickel ion, the nickel hexacyanoferrate may have characteristic XRD peaks at 17, 24, 25, 35, 38.5, 39.8, 49.5, 51, 53.5, 56.2 and 57.4 2θ (+0.2°). When the metal ion of the metal hexacyanoferrate having a rhombohedral crystal structure is a manganese ion, the manganese hexacyanoferrate may have characteristic XRD peaks at 17, 23.5, 24.2, 34.2, 37.8, 38.5, 48.2, 49.5, 52.2, 54.8 and 55.6 2θ (±0.2°).

An average particle size of the metal hexacyanoferrate having a rhombohedral crystal structure is dependent on time for a hydrothermal reaction, and may be 0.1 µm to 1 mm.

As an example, an average particle size of the nickel hexacyanoferrate after 4 hours of the hydrothermal reaction may be approximately 0.5 to 1 µm, and the nickel hexacyanoferrate has a spherical shape.

As described above, compared with Prussian blue, since the metal hexacyanoferrate having a rhombohedral crystal structure has a larger average particle size, it is easily separated through a filter after cesium adsorption.

The metal hexacyanoferrates having a rhombohedral crystal structure may agglomerate together to form a cluster. Due to the formation of such a cluster, the metal hexacyanoferrates can be more easily separated through a filter.

Method of Removing Cesium

The present invention provides a method of removing cesium, which includes: adsorbing cesium by dispersing the magnetic cesium adsorbent in a solution containing a cesium ion; and separating a cesium-adsorbed magnetic cesium adsorbent using a magnet or filter.

Specifically, the magnetic cesium adsorbent is dispersed in a solution containing a cesium ion to adsorb cesium, and then the cesium-adsorbed magnetic cesium adsorbent is separated using a magnet or filter.

The solution containing a cesium ion is preferably a solution containing Cs-137, which is one of the major radioactive isotopes, which may be, for example, any one of various types of water in swimming pools, streams, rivers, lakes, wetlands, etc., which are heavily polluted with Cs-137, or a Cs-137-containing liquid waste obtained from an atomic power plant.

The magnetic cesium adsorbent includes a metal hexacyanoferrate having a rhombohedral crystal structure, detailed descriptions are the same as above.

Since the magnetic cesium adsorbent itself has a magnetic property, it is possible to perform separation using a magnet without conjugation with separate magnetic nanoparticles. As an example, the separation using a magnet may be performed by dispersing the magnetic cesium adsorbent in a solution containing a cesium ion in a beaker, placing a neodymium magnet on an outer wall of the beaker, collecting the cesium-adsorbed magnetic cesium adsorbent on the inner wall of the beaker using the neodymium magnet and then discarding the residual solution.

Due to a large average particle size, the magnetic cesium adsorbent is also easily separated through a filter. As an example, the separation through a filter may be performed through a filter pore which is smaller than the cesium-adsorbed magnetic cesium adsorbent.

It is also possible to combine separation using a magnet and separation using a filter.

According to the cesium removal method, a cesium adsorption rate represented by Mathematical Expression 1 may be 90% or more:

Cesium adsorption rate (%)=(concentration of cesium in solution before separation−concentration of cesium in solution after separation)/concentration of cesium in solution before separation×100. [Mathematical Expression 1]

As described above, the magnetic cesium adsorbent containing the metal hexacyanoferrate having a rhombohedral crystal structure according to the present invention is prepared through a simple hydrothermal reaction of a metal hexacyanoferrate having a high cesium adsorption rate, preferably, a metal (particularly, nickel or manganese) hexacyanoferrate having a cubic crystal structure, and therefore, due to its magnetic property without separately introducing magnetic nanoparticles, the magnetic cesium adsorbent can be separated using a magnet, and since a particle size is increased by the hydrothermal reaction, separation using a filter is also facilitated.

Accordingly, in the event of a major accident at a nuclear facility such as a nuclear power plant, there is an advantage in which Cs-137, which is one of the major radioactive isotopes occurring in nuclear fission, can be effectively removed.

Hereinafter, to help in understanding the present invention, exemplary examples will be presented. However, the following examples are merely provided to more easily understand the present invention, and not to limit the present invention.

EXAMPLES

Example 1

A first solution was prepared by dissolving 2.69 g of $Ni(OCOCH_3)_2 \cdot 4H_2O$ (10 mmol) in 175 mL of $H_2O$ and 25 mL of DMF. A second solution was prepared by dissolving 4.84 g of $Na_4[Fe(CN)_6] \cdot 10H_2O$ (10 mmol) and 7 g of NaCl in 175 mL of $H_2O$. After the first solution was slowly added to the second solution, the mixture was stirred at room temperature for 72 hours to react, a pellet was collected by centrifugation, rinsed with methanol three times, and then dried in air, thereby preparing nickel hexacyanoferrate $(Na_2Ni[Fe(CN)_6])$ having a cubic crystal structure (refer to FIG. 1).

76 mg of nickel hexacyanoferrate having a cubic crystal structure was added to 5 mL of distilled water, dispersed by ultrasonication for 5 minutes, and subjected to a hydrothermal reaction in an autoclave at 140° C. for 4, 8 and 18 hours. After the end of the hydrothermal reaction, a reaction aqueous solution was removed, the residual product was rinsed with distilled water three times and vacuum-dried for 24 hours, thereby preparing nickel hexacyanoferrate (Na$_2$Ni[Fe(CN)$_6$]) having a rhombohedral crystal structure.

Figure 2:
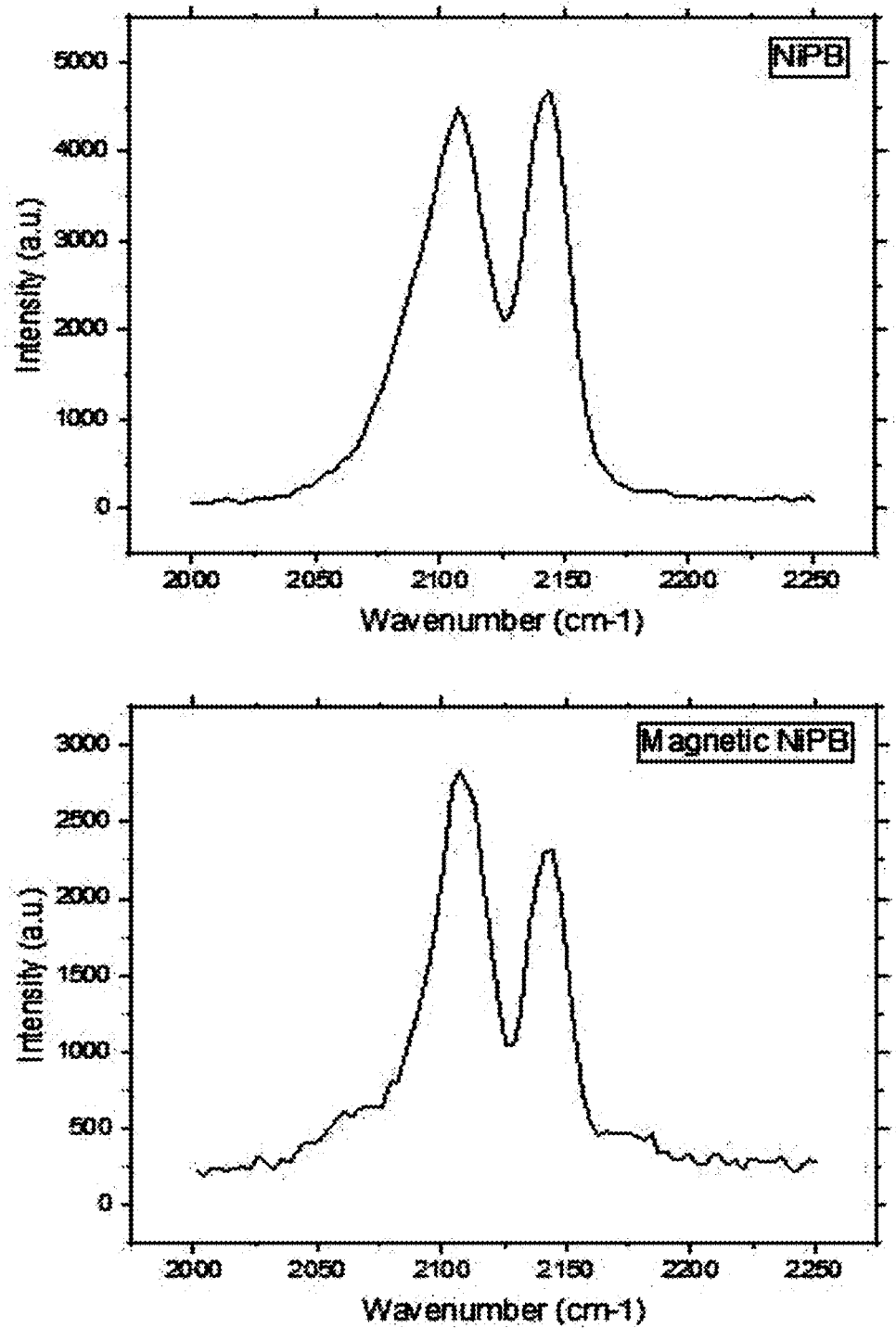
FIG. 2 is a graph showing a result of Raman spectroscopy for nickel hexacyanoferrate before a hydrothermal reaction and after 4 hours of the hydrothermal reaction.

FIG. 2 is a graph showing a result of Raman spectroscopy for nickel hexacyanoferrate before a hydrothermal reaction and after 4 hours of the hydrothermal reaction.

As shown in FIG. 2, in Raman spectroscopy analysis spectrum, a signal of the cyano ligand (CN–) binding with the nickel ion in the nickel hexacyanoferrate is detected at 2000 to 2250 cm$^{-1}$. Specifically, in the Raman spectroscopy analysis spectrum, since there is no significant difference in signal of the cyano ligand (CN$^-$) binding with the nickel ion of the nickel hexacyanoferrate before and after the hydrothermal reaction, although the hydrothermal reaction progressed, it can be confirmed that a new functional group was not formed, and a backbone between the nickel ion and the cyano ligand did not collapse.

Figure 3:
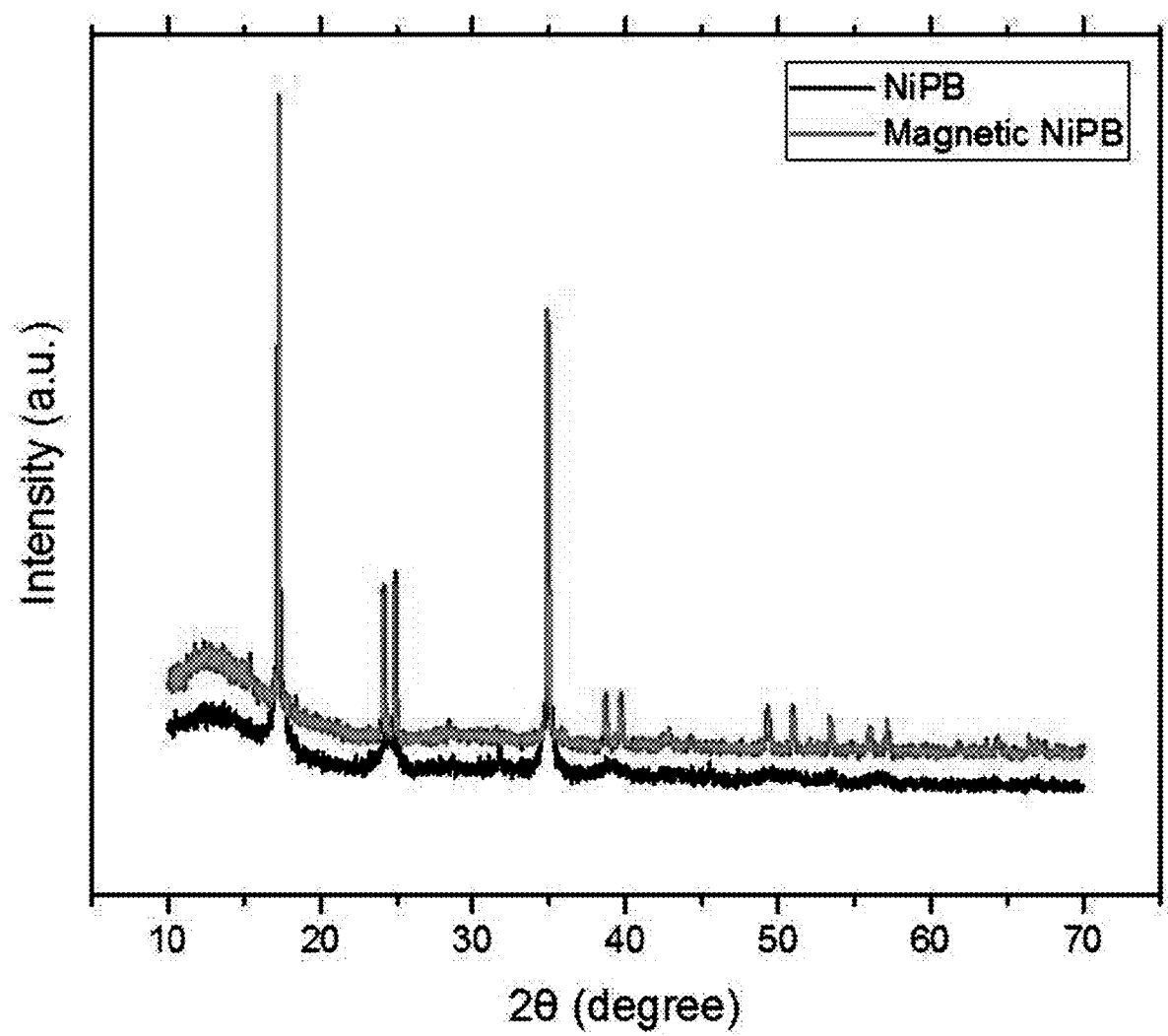
FIG. 3 is a graph showing a result of XRD pattern analysis for nickel hexacyanoferrate before a hydrothermal reaction and after 4 hours of the hydrothermal reaction.

FIG. 3 is a graph showing a result of XRD pattern analysis for nickel hexacyanoferrate before a hydrothermal reaction and after 4 hours of the hydrothermal reaction.

As shown in FIG. 3, unlike before the hydrothermal reaction, after 4 hours of the hydrothermal reaction, the nickel hexacyanoferrate has XRD peaks at 17, 24, 25, 35, 38.5, 39.8, 49.5, 51, 53.5, 56.2 and 57.4 2θ (±0.2°), confirming that the cubic crystal structure of the hexacyanoferrate before the hydrothermal reaction was changed into a rhombohedral crystal structure.

Figure 4:
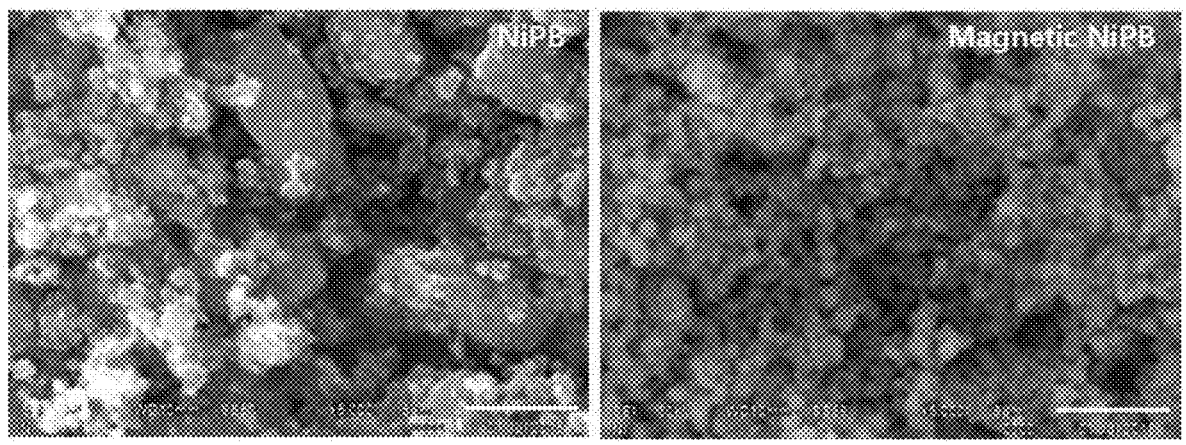
FIG. 4 is an image of a result of SEM analysis for nickel hexacyanoferrate before a hydrothermal reaction and after 4 hours of the hydrothermal reaction.

FIG. 4 is an image of s result of SEM analysis for nickel hexacyanoferrate before a hydrothermal reaction and after 4 hours of the hydrothermal reaction.

As shown in FIG. 4, it can be confirmed that an average particle size of the nickel hexacyanoferrate after 4 hours of the hydrothermal reaction was approximately 0.5 to 1 μm, and the particle had a spherical shape. For example, it can be confirmed that some of these particles agglomerated together to form a cluster. That is, it was confirmed that an average particle size of the nickel hexacyanoferrate after the hydrothermal reaction tended to increase.

Example 2

A first solution was prepared by dissolving 2.30 g of Mn(OCOCH$_3$)$_2$.4H$_2$O (9.2 mmol) in 50 mL of H$_2$O. A second solution was prepared by dissolving 1.14 g of Na$_4$[Fe(CN)$_6$].10H$_2$O (2.4 mmol) and 7 g of NaCl in 200 mL of H$_2$O. After the first solution was slowly added to the second solution, the mixture was stirred at room temperature for 72 hours to react, a pellet was collected by centrifugation, rinsed with methanol three times, and then dried in air, thereby preparing manganese hexacyanoferrate (Na$_2$Mn[Fe(CN)$_6$]) having a cubic crystal structure.

76 mg of manganese hexacyanoferrate having a cubic crystal structure was added to 5 mL of distilled water, dispersed by ultrasonication for 5 minutes, and subjected to a hydrothermal reaction in an autoclave at 120° C. and 140° C. for 4 hours. After the end of the hydrothermal reaction, a reaction aqueous solution was removed, the residual product was rinsed with distilled water three times and vacuum-dried for 24 hours, thereby preparing manganese hexacyanoferrate (Na$_2$Mn[Fe(CN)$_6$]) having a rhombohedral crystal structure.

Referring to the result of the XRD pattern analysis for the manganese hexacyanoferrate after 4 hours of the hydrothermal reaction, unlike before the hydrothermal reaction, the manganese hexacyanoferrate after 4 hours of the hydrothermal reaction shows XRD peaks at 17, 23.5, 24.2 34.2, 37.8, 38.5, 48.2, 49.5, 52.2, 54.8 and 55.6 2θ (±0.2°), confirming that the cubic crystal structure of the hexacyanoferrate before the hydrothermal reaction was changed into a rhombohedral crystal structure.

Experimental Example 1

According to Example 1, after 4, 8 and 18 hours of the hydrothermal reaction, 10 mg of the nickel hexacyanoferrate-containing cesium adsorbent was dispersed in 15 mL of a solution containing cesium ions (25 ppm) in a beaker, and then a neodymium magnet was placed on an outer wall of the beaker.

Figure 5:
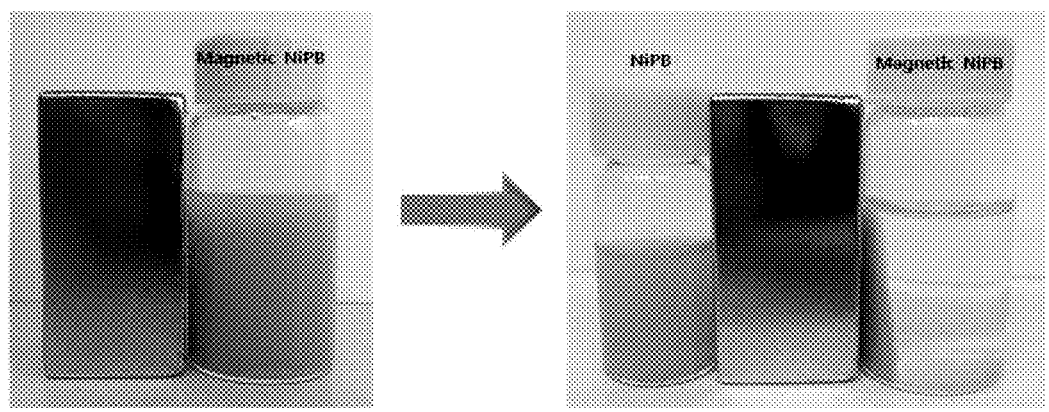
FIG. 5 is an image illustrating a magnetic property of a nickel hexacyanoferrate-containing cesium adsorbent before a hydrothermal reaction and after 4, 8 and 18 hours of the hydrothermal reaction.

As a result, FIG. 5 is an image illustrating a magnetic property of a nickel hexacyanoferrate-containing cesium adsorbent before a hydrothermal reaction and after 4, 8 and 18 hours of the hydrothermal reaction.

As shown in FIG. 5, it is confirmed that the nickel hexacyanoferrate-containing cesium adsorbent before the hydrothermal reaction does not have a magnetic property, and the nickel hexacyanoferrate-containing magnetic cesium adsorbent after the hydrothermal reaction exhibits magneticity.

Afterward, the cesium-adsorbed cesium adsorbent was collected on an inner wall of the beaker using the neodymium magnet and then a residual solution was discarded, followed by evaluating a cesium adsorption rate represented by Mathematical Expression 1 below through inductively coupled plasma-mass spectrometry (ICP-MS).

Cesium adsorption rate (%)=(concentration of cesium in solution before separation−concentration of cesium in solution after separation)/concentration of cesium in solution before separation×100.   [Mathematical Expression 1]

TABLE 1

| Time for hydrothermal reaction | Cs concentration before separation (ppm) | Cs concentration after separation (ppm) | Cs adsorption rate (%) |
| --- | --- | --- | --- |
| 4 hours | 25 | 2.5 | 90 |
| 8 hours | 25 | 4.5 | 82 |
| 18 hours | 25 | 7.1 | 72 |

As shown in Table 1, the nickel hexacyanoferrate-containing cesium adsorbent shows a maximum cesium adsorption rate of 90%, and it was confirmed that, according to an increased hydrothermal reaction time, the cesium adsorption rate tends to be reduced. This is because an open framework structure collapses due to cracks occurring at the bond between the metal ion and the cyano ligand when the hydrothermal reaction time is too long.

Experimental Example 2

According to Example 2, each of 10 mg of the manganese hexacyanoferrate-containing cesium adsorbent before a hydrothermal reaction and 10 mg of the manganese hexacyanoferrate-containing cesium adsorbent after 4 hours of the hydrothermal reaction at 120° C. and 140° C. was dispersed in 15 mL of a solution containing cesium ions (25 ppm) in a beaker, and then a neodymium magnet was placed on an outer wall of the beaker.

Afterward, the cesium-adsorbed cesium adsorbent was collected on an inner wall of the beaker using a neodymium magnet and then a residual solution was discarded, followed by evaluating a cesium adsorption rate represented by Mathematical Expression 1 below through ICP-MS.

Cesium adsorption rate (%)=(concentration of cesium in solution before separation−concentration of cesium in solution after separation)/concentration of cesium in solution before separation×100. [Mathematical Expression 1]

TABLE 2

| Hydrothermal reaction and temperature | Cs concentration before separation (ppm) | Cs concentration after separation (ppm) | Cs adsorption rate (%) |
|---|---|---|---|
| Before hydrothermal reaction | 25 | 0.179 | 99.3 |
| After hydrothermal reaction (120° C.) | 25 | 0.011 | 99.9 |
| After hydrothermal reaction (140° C.) | 25 | 0.087 | 99.9 |

As shown in Table 2, it is confirmed that the manganese hexacyanoferrate-containing magnetic cesium adsorbent shows a very high cesium adsorption rate of 99.9%. The manganese hexacyanoferrate before a hydrothermal reaction may have an exceptionally slight magnetic property, but may maximize the magnetic property through a hydrothermal reaction.

It would be understood by those of ordinary skill in the art that the above descriptions of the present invention are exemplary, and the example embodiments disclosed herein can be easily modified into other specific forms without changing the technical spirit or essential features of the present invention. Therefore, it should be interpreted that the example embodiments described above are exemplary in all aspects, and are not limitative.

What is claimed is:

1. A method of preparing a magnetic metal hexacyanoferrate for use as a cesium adsorbent, said method consisting of:
subjecting a metal hexacyanoferrate having a cubic crystal structure to a hydrothermal reaction at a temperature in the range of from about 120° C. to about 200° C. to convert the cubic crystal structure of said metal hexacyanoferrate to a rhombohedral crystal structure; and
optionally isolating and drying said metal hexacyanoferrate having the rhombohedral crystal structure.

2. The method according to claim 1, wherein, in the metal hexacyanoferrate having the cubic crystal structure, the carbon atoms of the cyano ligands form six coordinate bonds with the ferric ion, and the nitrogen atoms of the cyano ligands form six coordinate bonds with a metal ion.

3. The method according to claim 2, wherein the metal ion is a nickel or manganese ion.

4. The method according to claim 3, wherein, when the metal ion is a nickel ion, the metal hexacyanoferrate having a rhombohedral crystal structure shows XRD peaks at 17, 24, 25, 35, 38.5, 39.8, 49.5, 51, 53.5, 56.2 and 57.4 2θ (±0.2°).

5. The method according to claim 3, wherein, when the metal ion is a manganese ion, the metal hexacyanoferrate having a rhombohedral crystal structure shows XRD peaks at 17, 23.5, 24.2, 34.2, 37.8, 38.5, 48.2, 49.5, 52.2, 54.8 and 55.6 2θ (±0.2°).

6. The method according to claim 3, wherein an average particle size of the metal hexacyanoferrate having a rhombohedral crystal structure is 0.1 μm to 1 mm.

7. The method according to claim 3, wherein the metal hexacyanoferrates having a rhombohedral crystal structure agglomerate together to form a cluster.

8. The method according to claim 1, wherein the hydrothermal reaction is performed at 120 to 200° C. under a pressure of 2 to 15 bar for 20 minutes to 20 hours.

9. The method according to claim 8, further comprising the steps of isolating and drying said metal hexacyanoferrate having rhombohedral crystal structure.

10. The method of claim 8, wherein said magnetic metal hexacyanoferrate comprises nickel hexacyanoferrate or manganese hexacyanoferrate.

11. A method of removing cesium, comprising:
adsorbing cesium by dispersing a magnetic cesium adsorbent in a solution containing a cesium ion to produce a cesium-adsorbed magnetic cesium adsorbent; and
separating said cesium-adsorbed magnetic cesium adsorbent using a magnet or filter.

12. The method according to claim 11, wherein a cesium adsorption rate represented by Mathematical Expression 1 below is 90% or more:

Cesium adsorption rate (%)=(concentration of cesium in solution before separation−concentration of cesium in solution after separation)/concentration of cesium in solution before separation×100. [Mathematical Expression 1]

13. A method of preparing a magnetic metal hexacyanoferrate having a rhombohedral crystal structure, said method consisting of:
(a) placing a metal hexacyanoferrate having a cubic crystal structure in water to produce a mixture;
(b) heating the mixture to a temperature in the range of from 120° C. to about 200° C. at from about 2 to about 15 bar of pressure to convert the cubic crystal structure of said metal hexacyanoferrate to Rail the rhombohedral crystal structure; and
(c) optionally isolating and drying said magnetic metal hexacyanoferrate having the rhombohedral crystal structure.

14. The method of claim 13, wherein said step (b) of converting cubic crystal structure of said metal hexacyanoferrate to a rhombohedral crystal structure comprises subjecting the aqueous solution to said temperature and pressure conditions for a time ranging from about 20 minutes to about 20 hours.

15. The method of claim 13 further comprising the steps of isolating and drying said magnetic metal hexacyanoferrate having a rhombohedral crystal structure.

16. The method of claim 13, wherein an average particle size of said magnetic metal hexacyanoferrate having a rhombohedral crystal structure ranges from about 0.1 μm to about 1 mm.

17. A method of removing cesium from a sample comprising cesium, said method comprising:
(a) contacting a solution comprising said sample with a magnetic cesium adsorbent to produce a cesium-adsorbed magnetic cesium adsorbent complex, wherein said magnetic cesium adsorbent comprises a metal hexacyanoferrate having a rhombohedral crystal structure; and
(c) removing said cesium-adsorbed magnetic cesium adsorbent complex from said solution using a magnet or a filter.

* * * * *